United States Patent
Takahashi et al.

(10) Patent No.: US 6,656,664 B2
(45) Date of Patent: Dec. 2, 2003

(54) METHOD OF FORMING MINUTE FOCUSING LENS

(75) Inventors: Yoichi Takahashi, Tokyo (JP); Nobuhito Toyama, Tokyo (JP); Hiroyuki Matsui, Tokyo (JP)

(73) Assignee: Dai Nippon Printing Co., Ltd., Tokyo-To (JP)

( * ) Notice: Subject to any disclaimer, the term of this patent is extended or adjusted under 35 U.S.C. 154(b) by 0 days.

(21) Appl. No.: 10/255,381

(22) Filed: Sep. 26, 2002

(65) Prior Publication Data

US 2003/0059725 A1 Mar. 27, 2003

(30) Foreign Application Priority Data

Sep. 26, 2001 (JP) .......................................... 2001-292725

(51) Int. Cl.[7] .................................................. G03F 1/00
(52) U.S. Cl. ........................................ 430/321; 430/396
(58) Field of Search ............................... 430/321, 396, 430/5

(56) References Cited

U.S. PATENT DOCUMENTS 5,310,623 A * 5/1994 Gal .............................. 430/321
6,107,000 A * 8/2000 Lee et al. ...................... 430/296

FOREIGN PATENT DOCUMENTS

JP     2001-166109 A   *  6/2001
WO     WO 98/33091     *  7/1998

* cited by examiner

Primary Examiner—John A. McPherson
(74) Attorney, Agent, or Firm—Timothy J. Keefer; Wildman, Harrold, Allen & Dixon LLP

(57) ABSTRACT

The method of forming a minute focusing lens with respect to over a photoactive area of an image sensor such as a CCD or CMOS, comprising: coating a resist film on a flattening layer formed over the photoactive area of the image sensor; exposing the resist film to light via a photo-mask, and developing the resist film; and patterning the resist film into a lens configuration provides in this invention in order to form a lens having a designed configuration that provides a good light focusing efficiency. The photo-mask is a light transmission type having no light-shading layer. And, this photo-mask is the one having provided thereon a light transmission portion comprising a light refraction material, having on its surface portion a stairs portion, the stairs portion having the phase of a transmission light at its respective position controlled relative to a prescribed width so that a desired light intensity distribution may be obtained at the surface of the photo-mask light-exposed portion.

4 Claims, 4 Drawing Sheets

POST-DEVELOPMENT RESIST IMAGE

LIGHT INTENSITY DISTRIBUTION

LENS CONFIGURATION

METHOD OF FORMING MINUTE FOCUSING LENS

BACKGROUND OF THE INVENTION

The present invention relates to a method of forming a minute focusing lens with respect to over an image sensor portion such as a CCD or CMOS.

Conventionally, in an image sensor such as a CCD or CMOS, a minute focusing lens is formed with respect to the respective photoactive area in order to enhancing the focusing efficiency of the photoactive area.

In the above-described minute focusing lens, conventionally, a resin portion formed on the upside of the focusing portion is formed into a lens configuration by heat melting.

An example of this method will now be briefly explained below with reference to FIG. 4.

Incidentally, in FIG. 4, a reference numeral 301 denotes a device substrate (image sensor substrate), 302 denotes a silicon wafer, 303 denotes a photoactive area, 304 denotes a color filter, 304a denotes a flattening layer, 305 denotes a flattening layer, 306 denotes a resist layer, 307 denotes a photo-mask, 308 denotes exposure light, 309 denotes a resist pattern (post-development resist image), and 310 denotes a convex lens (post-heat-melting resist image).

This example is a case where, with respect to the device substrate 301 (FIG. 4A) having the color filter 304 disposed on the upside of the photoactive area 303 formed in one surface of the silicon wafer 302, a minute focusing lens is provided correspondingly to that photoactive area 303.

First, the flattening layer 305 covering the color filter 304 of the device substrate 301 is provided and, further, on this flattening layer 305, there is coated the resist layer 306 which is a photo-sensitive resin for forming the lens. (FIG. 4B).

Subsequently, in a state where the photo-mask 307 is located near the resist layer 306, the resist layer 306 is selectively exposed to light (FIG. 4C), and is development-treated to form in the region corresponding to the respective photoactive area 303 the resist pattern 309 that covers the photoactive area 303 and that is substantially shaped like a square. (FIG. 4D).

Thereafter, heat treatment is performed to cause the resist pattern 309 to heat melting to form the convex lens 310 corresponding to the respective photoactive area 303. (FIG. 4E).

In the case of this method, because forming the resist pattern 309 into the convex configuration by heat melting, it had the difficulty of forming a lens of good focusing efficiency having a desired focal distance.

Especially, in the CMOS image sensor having a significantly great distance up to the photoactive area, as far as concerning natural melting caused by heat treatment, it is impossible to form a lens configuration that is made as designed and that has a long focal distance.

As described above, conventionally, in the method of forming a minute focusing lens with respect to over the image sensor portion such as a CCD or CMOS, the lens configuration is formed by heat melting. Therefore, it is difficult to obtain a desired configuration, and, in addition, a limitation is also imposed upon the focusing efficiency. And, there has been a demand for appearance of the measure for coping with such circumstance.

SUMMARY OF THE INVENTION

The present invention has been made in order to cope with that circumstance and has an object to provide a method which, in a method of forming a minute focusing lens with respect to over the image sensor portion such as a CCD or CMOS, enables forming a lens of designed configuration having a good focusing efficiency.

To attain the above object, according to one aspect of the present invention, there is provided a method of forming a minute focusing lens being arranged to form a minute focusing lens with respect to over a photoactive area of an image sensor such as a CCD or CMOS, comprising; coating a resist film on a flattening layer formed over the photoactive area of the image sensor; exposing the resist film to light via a photo-mask; developing the resist film; and patterning the resist film into a lens configuration, wherein the photo-mask is a light transmission type having no light-shading layer and the photo-mask has provided thereon a light transmission portion comprising a light refraction material, having on its surface portion stairs portion, the stairs portion having the phase of a transmission light at its respective position controlled relative to a prescribed width so that a desired light intensity distribution may be obtained at the surface of the photo-mask light-exposed portion.

Further, the photo-mask, according to the phase shifting data, determined by calculation from the light intensity distribution data on the surface of the light-exposed portion matching with the configuration of the focusing lens desired to be formed and having obtained therefrom such light intensity distribution, of the transmission light at the respective position of the photo-mask, has the thickness at its respective position determined relative to a prescribed width of the phase shifting of the transmission light, to thereby provide a binary grating to the photo-mask configuration, and the photo-mask structure is worked into a configuration matching with that binary grating, whereby the photo-mask is the one having formed thereon the light transmission portion comprising a light refraction material, having on its surface the stairs portion.

Further, this method is the one which, in the above-described method, comprises, after patterning, radiating far ultra-violet rays and thereby curing the resin and bleaching the photo-sensitive material.

Incidentally, here, the wording "the respective position of the photo-mask" means the two-dimensional position that can be regarded as being two-dimensional position in the plane direction of the photo-mask, and the phase shifting of the transmission light at the respective position of the photo-mask, of course, corresponds to the change in thickness at the respective position of the photo-mask.

Further, as the method of forming the above-described mask having the stairs portion, there can be taken up, for example, a technique of performing multi-stage etching of the mask substrate, or a method of forming by performing deposition, etc. onto the mask substrate.

The method of forming a minute focusing lens according to the present invention is provided, by its being made up into the above-described construction, as a method which, in the method of forming a minute focusing lens over the image sensor portion such as a CCD or CMOS, enables forming a lens of designed configuration having a good focusing efficiency.

Specifically, the present method is realized by the one which comprises coating a resist film on a flattening layer formed over the photoactive area of the image sensor, exposing the resist film to light via a photo-mask, developing the resist film, and patterning the resist film into a lens configuration, whereby the photo-mask is a light transmission type having no light-shading layer and the photo-mask is the one having provided thereon a light transmission portion comprising light refraction material, having on its surface portion a stairs portion, the stairs portion having the phase of a transmission light at its respective position controlled relative to a prescribed width so that a desired light intensity distribution may be obtained at the surface of the photo-mask light-exposed portion.

For the photo-mask, there can be taken up, as the one that is at a practical-use level viewed from the aspect of manufacture, the photo-mask which, according to the phase shifting data, determined by calculation from the light intensity distribution data on the surface of the light-exposed portion matching with the configuration of the focusing lens desired to be formed and having obtained therefrom such light intensity distribution, of the transmission light at the respective position of the photo-mask, has the thickness at its respective position determined relative to a prescribed width of the phase shifting of the transmission light, to thereby provide a binary grating to the photo-mask configuration, and the photo-mask structure being worked into a configuration matching with that binary grating, whereby the photo-mask is the one having formed thereon the light transmission portion comprising a light refraction material, having on its surface the stairs portion.

Further, by, after patterning, further radiating far ultra-violet rays and thereby curing the resin and bleaching the photo-sensitive material, it is possible to enhance the transmission characteristic of the development-formed focusing lens.

The present invention, as described above, has enabled providing a method of, in the method of forming a minute focusing lens with respect to over the image sensor portion such as a CCD or CMOS, forming a lens having a designed configuration that provides a good light focusing efficiency.

DESCRIPTION OF THE PREFERRED EMBODIMENTS

Figure 1A:
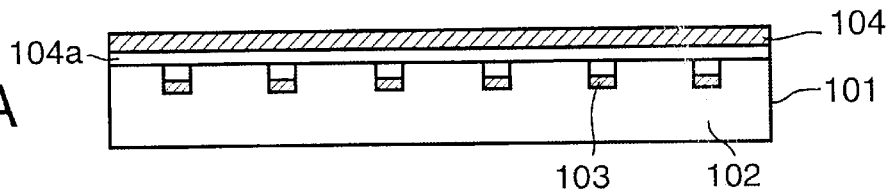
FIGS. 1A to 1E are process sectional views illustrating the processes of one example of an embodiment of a method of forming a minute focusing lens according to the present invention.

The present invention will be explained with reference to the drawings by taking up as an example an embodiment of a method of forming a minute focusing lens according to the present invention.

FIG. 1 is a process sectional view illustrating the processes of an embodiment of the method of forming a minute focusing lens according to the present invention. FIG. 2 is a view illustrating the relationship of the configuration of a focusing lens, which is manufactured with the method of forming a minute focusing lens according to the embodiment illustrated in FIG. 1, with the corresponding light intensity distribution of exposing light and with the configuration of a light transmission portion of the photo-mask. FIG. 3 is a view illustrating a method of making a binary grating of stairs level difference portions to a curvilinearly continued portion of the light transmission portion (lens).

FIGS. 2 and 3 each is a view concerning one sectional view of the manufacturing material.

In FIGS. 1, 2, and 3, a reference numeral 101 denotes a device substrate (image sensor substrate), 102 denotes a silicon wafer, 103 denotes a photoactive area, 104 denotes a color filter, 104a denotes a flattening layer, 105 denotes a flattening layer, 106 denotes a resist layer (also called "a resist film"), 107 denotes a photo-mask, 107a denotes a light transmission portion, 107b denotes a photo-mask substrate, 108 denotes exposure light, 110 denotes a post-development resist image, 110A denotes a resist image after bleaching treatment, 111 denotes far ultra-violet rays light, 210 denotes a light transmission portion (lens), 211 denotes a curvilinear portion, 215 denotes a concave portion, 220 denotes a light transmission portion (stairs lens), 221 denotes a stairs portion, 222 denotes a bottom portion, 225 denotes a concave portion, 225 denotes a concave portion, 230 denotes a thickness portion corresponding to the wavelength (of the exposure light), 240 denotes a light transmission portion (lens), 241 denotes a stairs portion, and 242 denotes a bottom portion.

An example of the method of forming a minute focusing lens according to this embodiment will now be explained with reference to FIG. 1.

This example is the method of forming a minute focusing lens with respect to over the photoactive area 103 of the device substrate 101 (FIG. 1A) which is an image sensor such as a CCD or CMOS having disposed therein the color filter 104. This method includes: coating the resist layer 106 on the flattening layer 105 formed over the photoactive area 103, i.e., on the color filter 104; and exposing the resist layer 106 to light via the photo-mask 107 and developing it and patterning it into a lens configuration. The photo-mask 107 used for this method is a light transmission type photo-mask having no light-shading layer and the photo-mask is the one having provided thereon a light transmission portion (corresponding to the 107a of FIG. 2C) comprising a light refraction material, having on its surface portion the stairs portion, the stairs portion having the phase of a transmission light at its respective position controlled relative to a prescribed width so that a desired light intensity distribution may be obtained at the surface of the photo-mask light-exposed portion.

The photo-mask 107 used in this example is the one having formed thereon the light transmission portion comprising a light refraction material, having on its surface portion the stairs portion, in the following way. Namely, according to the phase shifting data, determined by calculation from the light intensity distribution data on the surface of the light-exposed portion matching with the configuration of the focusing lens desired to be formed and having obtained therefrom such light intensity distribution, of the transmission light at the respective position of the photo-mask, there is determined the thickness at its respective position of the photo-mask relative to a prescribed width of the phase shifting of the transmission light, to thereby provide a binary grating to that configuration, and the photo-mask structure is worked into a configuration matching with that binary grating, to thereby form that light transmission portion. (This corresponds to the 240 of FIG. 3D).

Figure 1B:
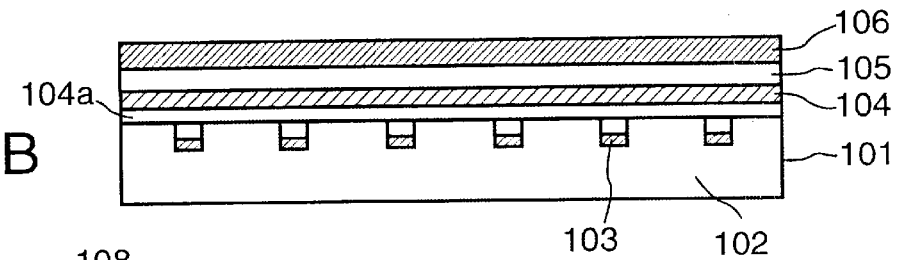

First, on the device substrate 101 (FIG. 1A) which is an image sensor such as a CCD or CMOS having disposed therein the color filter 104, the color filter 104 is adhered and thereby formed, then the flattening layer 105 covering the color filter 104 is further disposed thereon, and then the positive type resist layer 106, which is working material for forming the lens and which is photo-sensitive resin, is formed thereon into a prescribed thickness by a spin coating technique or the like beforehand (FIG. 1B).

Figure 1C:
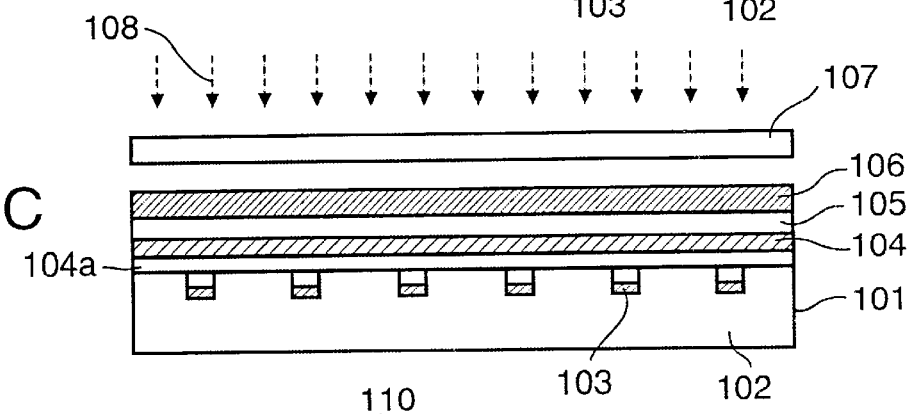

Subsequently, in the way previously stated, using the photo-mask 107 having formed therein the light transmission portion comprising a light refraction material, having on its surface portion the stairs portion, the resist layer 106 is exposed to light with the prescribed exposure light 108 (FIG. 1C).

Figure 1D:
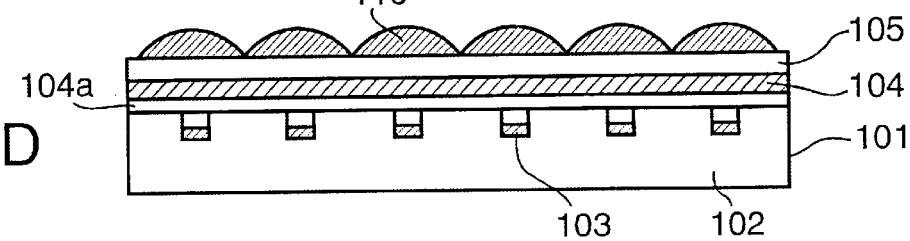
Figure 1E:
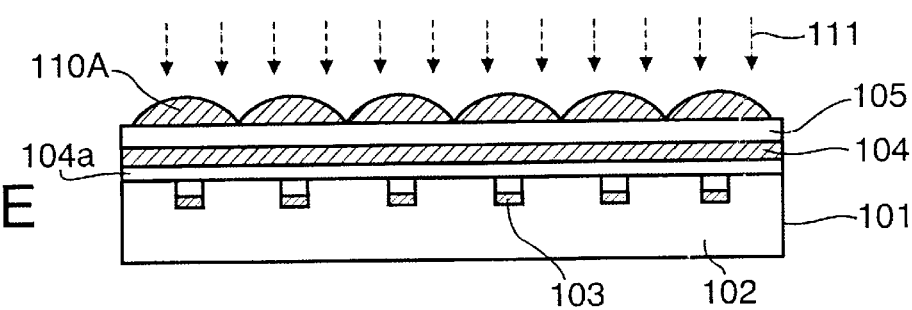

Subsequently, the resulting mass is subjected to development treatment and is patterned to thereby form the post-development resist image 110 into a lens configuration (FIG. 1D).

After patterning, far ultra-violet rays 111 are radiated, thereby curing the resin of the post-development resist image 110 and bleaching the photo-sensitive material (FIG. 1C).

Bleaching treatment is intended to enhance the transmission characteristic of the focusing lens that has been development-formed.

Here, as to the configuration of the light transmission portion of the photo-mask 107, a brief explanation will be given below with reference to FIGS. 2 and 3.

Figure 2A:
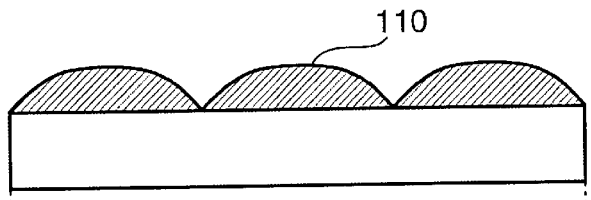
FIGS. 2A, 2B, and 2C are views illustrating the relationship of the configuration of the focusing lens, which is manufactured using the method of forming a minute focusing lens according to the embodiment illustrated in FIG. 1, with the corresponding light intensity distribution at the time of exposure and the corresponding configuration of the light transmission portion of the photo-mask.
Figure 2B:
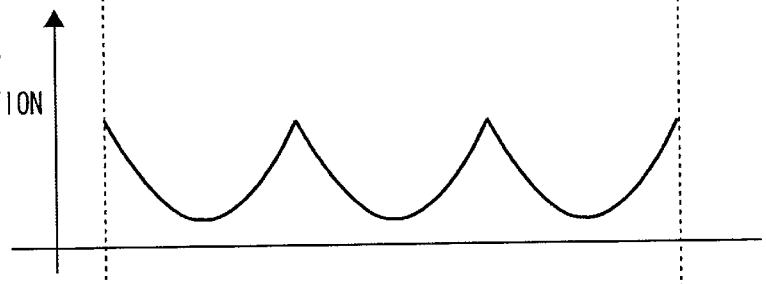

In a case where the desired sectional configuration of the focusing lens is a hatched portion 110 of FIG. 2A, in order to obtain such configuration by developing the positive type resist layer, the light intensity distribution such as that illustrated in FIG. 2B must be obtained at the surface portion of the resist layer located at the corresponding position.

The light intensity distribution is determined depending upon the sensitivity of the resist and the development characteristic.

Figure 2C:
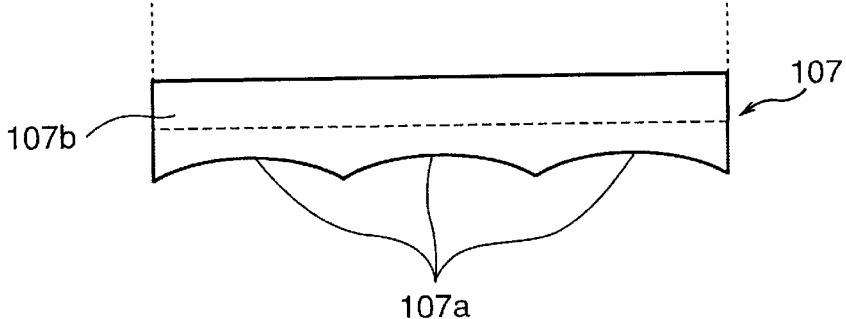

The configuration of the light transmission portion 107a illustrated in FIG. 2C which is for the purpose of obtaining the light intensity distribution such as that illustrated in FIG. 2B can be determined by Fourier transform calculation from the light intensity distribution data illustrated in FIG. 2B.

That configuration is determined as the phase shifting data, obtaining such light intensity distribution, of the transmission light at the respective position of the photo-mask.

Incidentally, although FIG. 2 is a corresponding view each illustrating one highlighted section, the light intensity distribution data and the transmission light phase shifting data are two-dimensional data corresponding to the respective positions of the photo-mask.

Also, in FIG. 2C, ordinarily, the light transmission portion 107a is formed by working the photo-mask substrate 107b, or further imparting the same quality of material to the photo-mask substrate 107b.

Figure 3A:
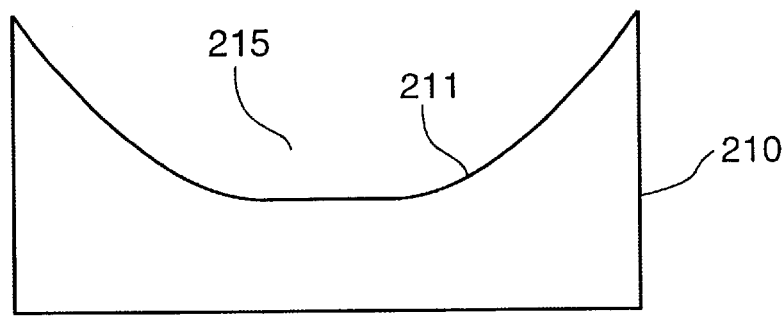
FIGS. 3A, 3B, 3C and 3D are views illustrating a method of binary grating to the curvilinear-continued portion of the light transmission portion (lens) to the stairs-like level difference portion.
Figure 3B:
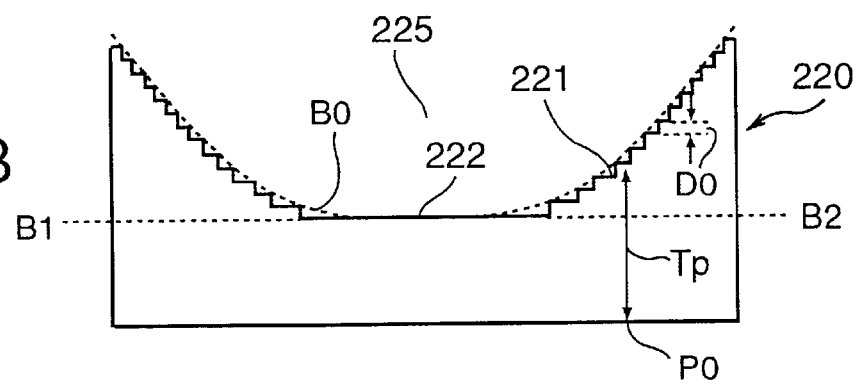
Figure 3C:
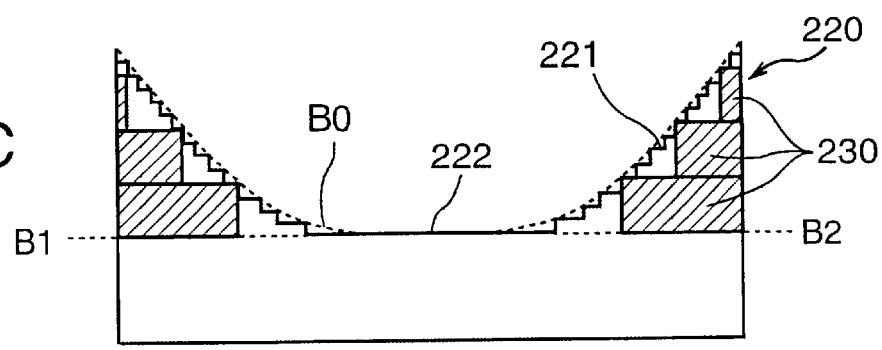

In a case where the light transmission portion (lens) having a configuration determined by the Fourier transform calculation in the above-described way is the light transmission portion 210 having the concave portion 215 in FIG. 3A, for example the light transmission portion 220 having the stairs portion 221 such as that illustrated in FIG. 3B can be used as a binary grating to that light transmission portion 210.

The minimum width as viewed in the thickness direction of the respective stepped portions of the stairs portion is a prescribed width of the phase shifting of the transmission light.

Namely, the stairs portion 221 such as that illustrated in FIG. 3B can be formed as follows. Namely, according to the phase shifting data, determined by calculation and having obtained therefrom the desired light intensity distribution, of the transmission light at the respective position of the photo-mask, the thickness at the respective position of the photo-mask is determined relative to the width at which the phase shifting of the transmission light has a prescribed value, to thereby provide a binary grating, and the light transmission portion 220 is worked into a configuration matching with that binary grating to provide that stairs portion 221.

Incidentally, in a case where forming the focusing lens such as that in this embodiment, ordinarily, the stairs portion becomes concentric.

Also, in FIG. 3B, the thickness at the point P0 of the photo-mask is represented by Tp and Do represents the minimum width in the thickness direction of the stairs portion.

Also, B0 corresponds to the curvilinear portion 211 of FIG. 3A.

As the basis for the bottom portion 222 of FIG. 3B, the thickness as located on the side, therefrom, wherein the concave portion 225 is formed contributes to causing phase shifting in the transmission light. Therefore, even if the thickness portion 230 (hatched portion) corresponding to the shifting in the phase of $2\pi$ of the exposure light shown in FIG. 3C does not exist; the circumstances are the same when viewed from the standpoint of the phase. Accordingly, the light transmission portion 240 illustrated in FIG. 3D which is in a state having removed therefrom a thickness corresponding to the thickness portion 230 corresponding to the wavelength of the exposure light can be said as being equivalent to the light transmission portion 220 illustrated in FIGS. 3B and 3C.

Figure 3D:
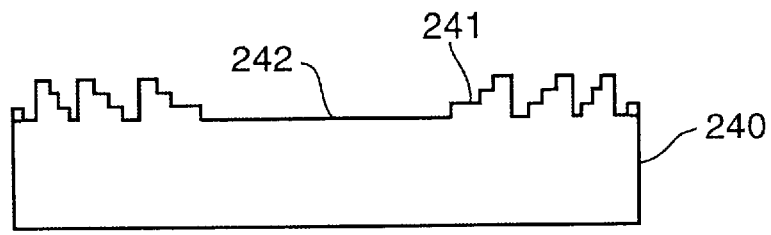
Figure 4A:
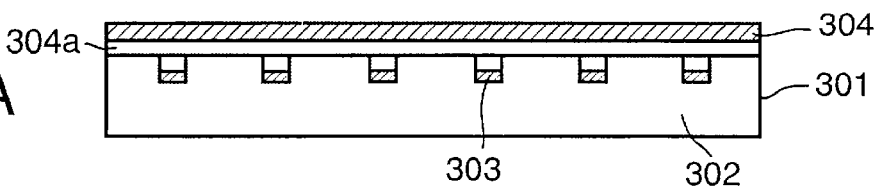
FIGS. 4A, 4B, 4C, 4D and 4E are process sectional views illustrating the processes of a conventional method of forming a minute focusing lens.
Figure 4B:
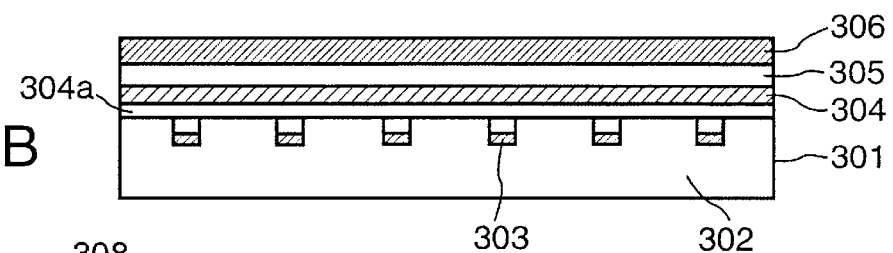
Figure 4C:
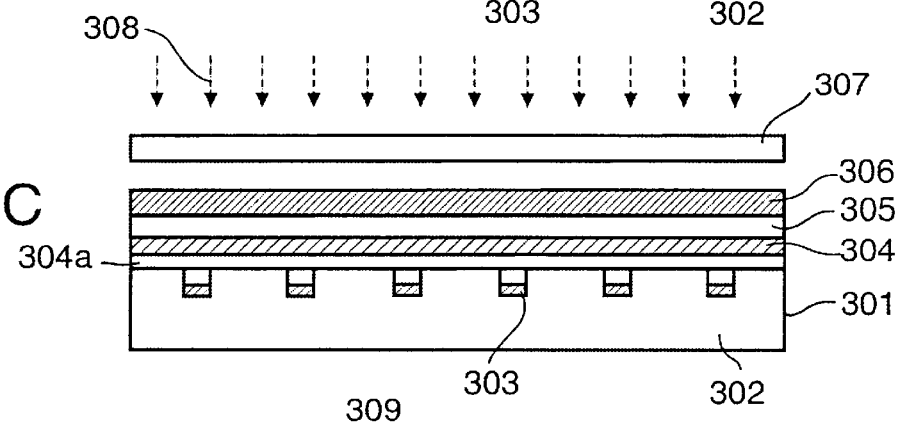
Figure 4D:
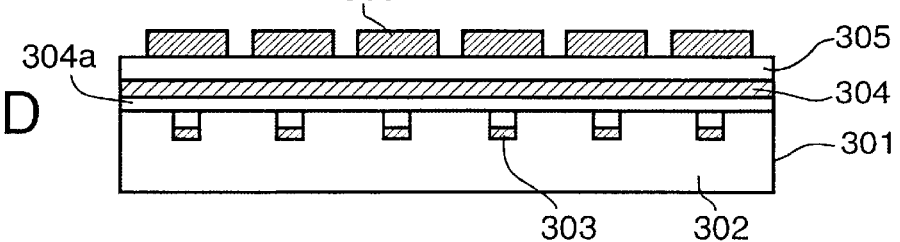
Figure 4E:
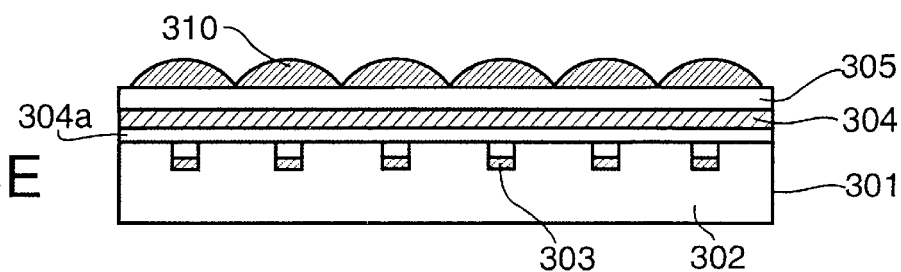

Namely, the light transmission portion 240 illustrated in FIG. 3D is equivalent to the light transmission portion 220 having the stairs portion 221 such as that illustrated in FIG. 3B and therefore this light transmission portion 240 is a binary grating to the light transmission portion 210 having the concave portion 215 of FIG. 3A.

Incidentally, to form the light transmission portion 240 equipped with a bottom portion 242 as well as with the stairs portion 241 having an N number of stepped portions, when $\lambda$ represents the wavelength of the exposure light; n represents the index of refraction of the light transmission portion; and the stairs has an N number of stepped portions, the minimum width in the thickness direction of the stepped portion is set as being $[(N-1)/N][\lambda/(n-1)]$.

Incidentally, the light transmission portion 210 having the configuration illustrated in FIG. 3A has the difficulty of being manufactured and, ordinarily, the light transmission portion 240 having a lesser number of stepped portions illustrated in FIG. 3D is used from the standpoint of its workability.

Working is conducted with a multi-stage photo-etching technique or the selective formation that is made using a deposition technique or the like.

In the case of the multi-stage photo-etching technique, formation of a light transmission portion is performed by working a photo-mask substrate, while, on the other hand, in the case of performing selective formation by using the deposition technique, formation is performed by depositing the same material as the substrate.

For example, in the case of the multi-stage photo-etching, a plate-making process wherein coating of a resist, writing exposure, and development are performed and a by-dry-etching process including a series of processing wherein dry-etching is performed of the working material (photo-mask substrate) corresponding to the opening regions of the resist after the plate-making process was done are repeated in stages a plurality of times, to thereby form a stairs-like stepped portion on the surface of the plate-like material, for use for working, comprising a light refraction material.

Incidentally, in the photo-etching process in the respective stage, if necessary, a chrome, etc. based light-shading film, etc. is formed on one surface of the working material.

The light-shading film, etc. is etched and is used as a resistance-to-etching mask, etc. when etching the working material exposed from those openings of the light-shading film.

In these cases, after working the working material, the light-shading film, etc. is removed away.

As the working material 110 there is ordinarily used a quartz glass substrate (that also includes a synthetic quartz substrate). However, the present invention is not limited thereto.

What is claimed is:

1. A method of forming a minute focusing lens, the method of forming a minute focusing lens being adapted to form a minute focusing lens with respect to over a photo-active area of an image sensor such as a CCD or CMOS, comprising:

coating a resist film on a flattening layer formed over the photoactive area of the image sensor;

exposing the resist film to light via a photo-mask, and developing the resist film; and patterning the resist film into a lens configuration, wherein the photo-mask is a light transmission type having no light-shading layer and the photo-mask has provided thereon a light transmission portion comprising a light refraction material, having on its surface portion a stairs portion, the stairs portion having the phase of a transmission light at its respective position controlled relative to a prescribed width so that a desired light intensity distribution may be obtained at the surface of the light-exposed portion.

2. A method of forming a minute focusing lens according to claim 1, wherein the photo-mask, according to the phase shifting data, determined by calculation from the light intensity distribution data on the surface of the light-exposed portion matching with the configuration of the focusing lens desired to be formed and having obtained therefrom such light intensity distribution, of the transmission light at the respective position of the photo-mask, has the thickness at its respective position determined relative to a prescribed width of the phase shifting of the transmission light, to thereby provide a binary grating to the photo-mask configuration, and the photo-mask structure is worked into a configuration matching with that binary grating, whereby the photo-mask is the one having formed thereon the light transmission portion comprising a light refraction material, having on its surface the stairs portion.

3. A method of forming a minute focusing lens according to claim 2, further comprising, after patterning, radiating far ultra-violet rays and thereby curing the resin and bleaching the photo-sensitive material.

4. A method of forming a minute focusing lens according to claim 1, further comprising, after patterning, radiating far ultra-violet rays and thereby curing the resin and bleaching the photo-sensitive material.

* * * * *